(12) United States Patent
Suzuki et al.

(10) Patent No.: US 8,151,046 B2
(45) Date of Patent: Apr. 3, 2012

(54) DISK ARRAY APPARATUS AND METHOD FOR CONTROLLING THE SAME

(75) Inventors: Katsuyoshi Suzuki, Odawara (JP); Akihisa Hirasawa, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/370,846

(22) Filed: Feb. 13, 2009

(65) Prior Publication Data
US 2009/0150609 A1    Jun. 11, 2009

Related U.S. Application Data

(63) Continuation of application No. 11/056,005, filed on Feb. 14, 2005, now Pat. No. 7,523,258, which is a continuation of application No. 10/659,398, filed on Sep. 11, 2003, now Pat. No. 7,080,201.

(30) Foreign Application Priority Data

May 22, 2003    (JP) .................. 2003-145111

(51) Int. Cl.
*G06F 12/00*    (2006.01)
(52) U.S. Cl. ............ 711/112; 711/114; 710/22; 710/27; 710/28; 714/6.22
(58) Field of Classification Search .................. 711/112, 711/114; 710/22, 27, 28; 714/6.22
See application file for complete search history.

(56) References Cited

U.S. PATENT DOCUMENTS

| | | | |
|---|---|---|---|
| 5,423,046 A | 6/1995 | Nunnelley et al. | |
| 5,475,814 A | 12/1995 | Tomimitsu | |
| 5,546,558 A | 8/1996 | Jacobson et al. | |
| 5,603,003 A | 2/1997 | Akizawa et al. | |
| 5,805,788 A | 9/1998 | Johnson | |
| 5,812,754 A | 9/1998 | Lui et al. | |
| 5,822,782 A | 10/1998 | Humlicek et al. | |
| 5,832,204 A | 11/1998 | Apperley et al. | |
| 5,832,244 A | 11/1998 | Jolley et al. | |
| 5,838,891 A | 11/1998 | Mizuno et al. | |
| 5,845,319 A | 12/1998 | Yorimitsu | |

(Continued)

FOREIGN PATENT DOCUMENTS

EP    0795824    9/1997

(Continued)

OTHER PUBLICATIONS

Serial Attached SCSI and Serial ATA Compatibility, Intel, 2002, pp. 1-8.

(Continued)

*Primary Examiner* — Matthew Bradley
(74) *Attorney, Agent, or Firm* — Mattingly & Malur, PC

(57) ABSTRACT

The disk array apparatus includes a controller having a communication control unit for accepting a data input/output request, a disk controller unit for controlling a plurality of disk drives, and a cache memory for temporarily storing data transferred between the communication control unit and the disk controller unit. A plurality of cooling fans are provided for cooling the plurality of disk drives. In response to receiving a request, the controller controls the rotational speed of a first cooling fan related to a first disk drive, which is related to the request, and changes an operational mode of the first disk drive related to the request such that the rotational speed of the first cooling fan is increased before the operational mode of the first disk drive is changed.

14 Claims, 12 Drawing Sheets

U.S. PATENT DOCUMENTS

| | | | |
|---|---|---|---|
| 5,848,282 | A | 12/1998 | Kang et al. |
| 5,867,736 | A | 2/1999 | Jantz |
| 5,875,965 | A * | 3/1999 | Lee .......................... 236/44 C |
| 5,884,098 | A | 3/1999 | Mason, Jr. |
| 5,951,691 | A | 9/1999 | Ng et al. |
| 6,061,750 | A | 5/2000 | Beardsley et al. |
| 6,108,748 | A | 8/2000 | Ofek et al. |
| 6,115,797 | A | 9/2000 | Kanda et al. |
| 6,137,679 | A | 10/2000 | Chang |
| 6,154,850 | A | 11/2000 | Idleman et al. |
| 6,173,360 | B1 | 1/2001 | Beardsley et al. |
| 6,201,692 | B1 | 3/2001 | Gamble et al. |
| 6,219,752 | B1 | 4/2001 | Sekido |
| 6,219,753 | B1 | 4/2001 | Richardson |
| 6,223,249 | B1 | 4/2001 | Kato et al. |
| 6,240,486 | B1 | 5/2001 | Ofek et al. |
| 6,282,602 | B1 | 8/2001 | Blumenau et al. |
| 6,351,375 | B1 | 2/2002 | Hsieh et al. |
| 6,400,730 | B1 | 6/2002 | Latif et al. |
| 6,449,709 | B1 | 9/2002 | Gates |
| 6,484,236 | B2 | 11/2002 | Fujimoto et al. |
| 6,484,269 | B1 | 11/2002 | Kopylovitz |
| 6,502,108 | B1 | 12/2002 | Day, III et al. |
| 6,510,491 | B1 | 1/2003 | Franklin et al. |
| 6,542,954 | B1 | 4/2003 | Aruga |
| 6,549,978 | B2 | 4/2003 | Mansur et al. |
| 6,553,408 | B1 | 4/2003 | Merrell et al. |
| 6,606,690 | B2 | 8/2003 | Padovano |
| 6,628,513 | B1 | 9/2003 | Gallagher et al. |
| 6,636,934 | B1 | 10/2003 | Linnell |
| 6,640,278 | B1 | 10/2003 | Nolan et al. |
| 6,651,137 | B2 | 11/2003 | Baek et al. |
| 6,658,592 | B1 | 12/2003 | Cohen et al. |
| 6,676,026 | B1 * | 1/2004 | McKinley et al. ............ 236/49.3 |
| 6,684,282 | B1 | 1/2004 | Kocis |
| 6,684,295 | B2 | 1/2004 | Fujimoto et al. |
| 6,708,232 | B2 | 3/2004 | Obara et al. |
| 6,728,922 | B1 | 4/2004 | Sundaram et al. |
| 6,745,287 | B2 | 6/2004 | Fujimoto et al. |
| 6,763,409 | B1 | 7/2004 | Elliott |
| 6,763,436 | B2 | 7/2004 | Gabber et al. |
| 6,772,108 | B1 | 8/2004 | Stolowitz |
| 6,772,287 | B2 | 8/2004 | Uchiyama et al. |
| 6,772,365 | B1 | 8/2004 | Obara |
| 6,792,486 | B1 | 9/2004 | Hanan et al. |
| 6,831,839 | B2 | 12/2004 | Bovell |
| 6,834,326 | B1 | 12/2004 | Wang et al. |
| 6,859,896 | B2 | 2/2005 | Apperley et al. |
| 6,862,173 | B1 | 3/2005 | Konshak et al. |
| 6,862,648 | B2 | 3/2005 | Yatziv |
| 6,871,244 | B1 | 3/2005 | Cahill et al. |
| 6,886,051 | B2 | 4/2005 | Thiesfeld |
| 6,886,059 | B2 | 4/2005 | Smith et al. |
| 6,922,738 | B2 | 7/2005 | Drescher et al. |
| 6,925,519 | B2 | 8/2005 | Day et al. |
| 6,925,531 | B2 | 8/2005 | Konshak et al. |
| 6,934,769 | B2 | 8/2005 | Smith |
| 6,950,263 | B2 | 9/2005 | Suzuki et al. |
| 6,996,642 | B2 | 2/2006 | Apperley et al. |
| 7,080,190 | B2 | 7/2006 | Weber |
| 7,353,321 | B2 | 4/2008 | Steinmetz et al. |
| 7,421,517 | B2 | 9/2008 | Beckett et al. |
| 7,487,283 | B2 | 2/2009 | Sivertsen |
| 7,543,085 | B2 | 6/2009 | Beckett et al. |
| 2001/0014956 | A1 | 8/2001 | Nagata et al. |
| 2001/0019509 | A1 | 9/2001 | Aho et al. |
| 2001/0046118 | A1 | 11/2001 | Yamanashi et al. |
| 2001/0054136 | A1 | 12/2001 | Ninomiya et al. |
| 2001/0056527 | A1 | 12/2001 | Ninomiya et al. |
| 2002/0007469 | A1 | 1/2002 | Taketa et al. |
| 2002/0019897 | A1 | 2/2002 | Cruyningen |
| 2002/0040413 | A1 | 4/2002 | Okada et al. |
| 2002/0049886 | A1 | 4/2002 | Furuya et al. |
| 2002/0062387 | A1 | 5/2002 | Yatziv |
| 2002/0062454 | A1 | 5/2002 | Fung |
| 2002/0069317 | A1 | 6/2002 | Chow et al. |
| 2002/0069334 | A1 | 6/2002 | Hsia et al. |
| 2002/0138705 | A1 | 9/2002 | Suzuki et al. |
| 2002/0144048 | A1 | 10/2002 | Bolt et al. |
| 2002/0144057 | A1 | 10/2002 | Li et al. |
| 2002/0147945 | A1 | 10/2002 | Fox et al. |
| 2002/0162048 | A1 | 10/2002 | Ackaret et al. |
| 2002/0162057 | A1 | 10/2002 | Talagala |
| 2003/0031187 | A1 | 2/2003 | Heffernan et al. |
| 2003/0041201 | A1 | 2/2003 | Rauscher |
| 2003/0041278 | A1 | 2/2003 | Lin |
| 2003/0046460 | A1 | 3/2003 | Inoue et al. |
| 2003/0097487 | A1 | 5/2003 | Rietze et al. |
| 2003/0097504 | A1 | 5/2003 | Oeda et al. |
| 2003/0097607 | A1 | 5/2003 | Bessire |
| 2003/0110330 | A1 | 6/2003 | Fujie et al. |
| 2003/0115437 | A1 | 6/2003 | Tomita |
| 2003/0131291 | A1 | 7/2003 | Morrison et al. |
| 2003/0135577 | A1 | 7/2003 | Weber et al. |
| 2003/0145167 | A1 | 7/2003 | Tomita |
| 2003/0149840 | A1 | 8/2003 | Bolt et al. |
| 2003/0163639 | A1 | 8/2003 | Baum |
| 2003/0167439 | A1 | 9/2003 | Talagala et al. |
| 2003/0172150 | A1 | 9/2003 | Kennedy |
| 2003/0182502 | A1 | 9/2003 | Kleiman et al. |
| 2003/0189811 | A1 | 10/2003 | Peeke et al. |
| 2003/0196002 | A1 | 10/2003 | Nakayama et al. |
| 2003/0196147 | A1 | 10/2003 | Hirata et al. |
| 2003/0204671 | A1 | 10/2003 | Matsunami et al. |
| 2003/0212859 | A1 | 11/2003 | Ellis |
| 2003/0221061 | A1 | 11/2003 | El-Batal |
| 2003/0221077 | A1 | 11/2003 | Ohno et al. |
| 2003/0231420 | A1 | 12/2003 | Kano et al. |
| 2004/0010660 | A1 | 1/2004 | Konshak et al. |
| 2004/0010662 | A1 | 1/2004 | Aruga |
| 2004/0024930 | A1 | 2/2004 | Nakayama et al. |
| 2004/0034731 | A1 | 2/2004 | Sivertsen |
| 2004/0068610 | A1 | 4/2004 | Umberger et al. |
| 2004/0073747 | A1 | 4/2004 | Lu |
| 2004/0078707 | A1 | 4/2004 | Apperley et al. |
| 2004/0088482 | A1 | 5/2004 | Tanzer et al. |
| 2004/0107325 | A1 | 6/2004 | Mori |
| 2004/0111485 | A1 | 6/2004 | Mimatsu et al. |
| 2004/0111560 | A1 | 6/2004 | Takase et al. |
| 2004/0117517 | A1 | 6/2004 | Beauchamp et al. |
| 2004/0117522 | A1 | 6/2004 | Loffink et al. |
| 2004/0117534 | A1 | 6/2004 | Parry et al. |
| 2004/0128627 | A1 | 7/2004 | Zayas |
| 2004/0139260 | A1 | 7/2004 | Steinmetz |
| 2004/0148329 | A1 | 7/2004 | Ogasawara et al. |
| 2004/0148460 | A1 | 7/2004 | Steinmetz |
| 2004/0148461 | A1 | 7/2004 | Steinmetz |
| 2004/0153614 | A1 | 8/2004 | Bitner et al. |
| 2004/0162940 | A1 | 8/2004 | Yagisawa et al. |
| 2004/0169996 | A1 | 9/2004 | Paul et al. |
| 2004/0177218 | A1 | 9/2004 | Meehan et al. |
| 2004/0193760 | A1 | 9/2004 | Matsunami et al. |
| 2004/0193791 | A1 | 9/2004 | Felton et al. |
| 2004/0199515 | A1 | 10/2004 | Penny et al. |
| 2004/0221101 | A1 | 11/2004 | Voorhees et al. |
| 2004/0236908 | A1 | 11/2004 | Suzuki et al. |
| 2004/0243386 | A1 | 12/2004 | Stolowitz et al. |
| 2004/0267516 | A1 | 12/2004 | Jibbe et al. |
| 2004/0268037 | A1 | 12/2004 | Buchanan, Jr. et al. |
| 2004/0268069 | A1 | 12/2004 | Satoyama et al. |
| 2005/0027900 | A1 | 2/2005 | Pettey |
| 2005/0097132 | A1 | 5/2005 | Cochran et al. |
| 2005/0117468 | A1 | 6/2005 | Kano et al. |
| 2005/0120263 | A1 | 6/2005 | Kano et al. |
| 2005/0120264 | A1 | 6/2005 | Kano et al. |
| 2005/0138154 | A1 | 6/2005 | Seto |
| 2005/0154942 | A1 | 7/2005 | Kano et al. |
| 2009/0164720 | A1 | 6/2009 | Suzuki et al. |

FOREIGN PATENT DOCUMENTS

| | | |
|---|---|---|
| EP | 0844561 | 5/1998 |
| EP | 1001345 | 5/2000 |
| EP | 1315074 | 5/2003 |
| JP | 02-188835 | 7/1990 |
| JP | 02188835 | 7/1990 |
| JP | 05-150909 | 6/1993 |
| JP | 5150909 | 6/1993 |

| | | |
|---|---|---|
| JP | 09-330182 | 12/1997 |
| JP | 9330182 | 12/1997 |
| JP | 09330184 | 12/1997 |
| JP | 10311720 | 11/1998 |
| JP | 2001-100922 | 4/2001 |
| JP | 2001-142650 | 5/2001 |
| JP | 2001142650 | 5/2001 |
| JP | 2001167040 | 6/2001 |
| JP | 2001-211411 | 8/2001 |
| JP | 2001-356883 | 12/2001 |
| JP | 2001337868 | 12/2001 |
| JP | 2002150746 | 5/2002 |
| JP | 2002/ 333954 | 11/2002 |
| JP | 2002333954 | 11/2002 |
| JP | 2003-036146 | 2/2003 |
| JP | 200336146 | 2/2003 |
| JP | 2004-178557 | 6/2004 |
| JP | 2004178557 | 6/2004 |
| WO | 99/50754 | 10/1999 |

OTHER PUBLICATIONS

ESG Product Brief EMC, Mar. 2003, CIARiiON With ATA, pp. 1-2.
EMC CLARiiON Backup Storage Solutions Back-up-to-Disk Guide with LEGATO Networker Diskbackup Option (DBO), Engineering White Paper, Apr. 8, 2003, pp. 1-28.
EMC CLARiiON Backup Storage Solutions Backup-to-disk Guide with Computer Associates' BrightStor ARCserve Backup, Engineering White Paper, Apr. 16, 2003, pp. 1-28.
EMC CLARiiON Backup Storage Solutions Backup-to-Disk: An Overview, Engineering White Paper, Mar. 3, 2003, pp. 1-10.
EMC CLARiiON Backup Storage Solutions Backup-to-Disk Guide with CommVault Galaxy, Engineering White Paper, Mar. 3, 2003, pp. 1-26.
EMC CLARiiON Backup Storage Solutions Backup-to-Disk Guide with Computer Associates BrightStor Enterprise Backup, Engineering White Paper, Apr. 16, 2003, pp. 1-23.
IBM Technical Disclosure Bulletin vol. 38, No. 7, Jul. 1995 (New York), "Foreground/Background Checking of Parity in a Redundant Array of Independent Disks-5 Storage Subsystem", pp. 455-458.
Laboratory Automation and Information Management 32, 1996, (Elsevier Science B.V.), R E Dessey, "Computer Connections", pp. 53-62.
EMC 2-Gigabit Disk-Array Enclosure EMC Corporation (DAE2), FC and ATA Models, Hardware Reference P/N 014003048, Rev A02.
SGI InfiniteStorage TP9300S Storage Array, Data Sheet, available at: http://www.sgi.com/pdfs/3643.pdf.
Adaptec FS4500 Fibre to SATA RAID, Data Sheet, available at: http:/www.sunstarco.com/PDF%20Files/Adaptec%20FS4500%20SATA.pdf.
Infortrend EonStor A16F-R1211/S1211 FC-to-SATA RAID Subsystem product information, available at: http://www.infortrend.com/2_product/a16f-r(s)1211.asp.
Synetic Inc., SyneRAID -800SA, SCSI/Fibre-toSATA RAID Subsystem product information, available at: http://www.synetic.net/Synetic-Products/SyneRAID-Units/SyneRAID-800SATA/SyneRAID-800SA.html.
"SATA Disk System and Expansion of Unit offer 3.5 TB storage", Product News Network, Nov. 1, 2004.
JP 2003-145111, Office Action dated Oct. 2, 2007, English translation of relevant portion, 7 pages.
Judd, Ian, "Device Services Interface", Online, Jun. 19, 1996, pp. 1-8.
"Veritas Volume Manager Storage Administrator 3.2, Administrator's Guide", Veritas Software Corporation, Online, Jul. 2001, pp. 1-184.
SGI InfiniteStorage TP9300S Storage Array, Data Sheet, Copyright 2004, available at: http://www.sgi.com/pdfs/3643.pdf.
Adaptec FS4500 Fibre to SATA RAID, Data Sheet, Copyright 2003, available at: http:/www.sunstarco.com/PDF%20Files/Adaptec%20FS4500%20SATA.pdf.
Infortrend EonStor A16F-R1211/S1211 FC-to-SATA RAID Subsystem product information, Oct. 8, 2005, available at: http://www.infortrend.com/2_product/a16f-r (s)1211.asp.
Synetic Inc., SyneRAID -800SA, SCSI/Fibre-toSATA RAID Subsystem product information, Oct. 10, 2005, available at: http://www.synetic.net/Synetic-Products/SyneRAID-Units/SyneRAID-800SATA/SyneRAID-800SA.html.
EMC 2-Gigabit Disk-Array Enclosure EMC Corporation (DAE2), FC and ATA Models, Hardware Reference P/N 014003048, Rev A02, Feb. 2003.
Drive Swapping, http://www.pcguide.com/ref/hdd/perf/raid/conf/advSwapping-c.html, Apr. 17, 2001, 3 pages.
External Storage Enclosures, http://replay.waybackmachine.org/20011202064442/http://www.amtrade . . . , Oct. 2001, 4 pages.
HP A5856A RAID 4Si PCI 4-Channel Ultra2 SCSI Controller, Installation and Administration Guide, Edition 3, Hewlett-Packard Company, 2001, pp. 1-198.
02-157r0 SAS Proposed Serial Attached SCSI working draft, Information Technology—Serial Attached SCSI (SAS), Revision pre0, Apr. 25, 2002, pp. 1-218.
Serial ATA: High Speed Serialized AT Attachment, Revision 1.0, Aug. 29, 2001, Serial ATA Workgroup, pp. 1-306.
Technology Presentation, "Serial Attached SCSI", Industry Working Group, Dec. 2001, pp. 1-13.

\* cited by examiner

FIG.1A
FIG.1B
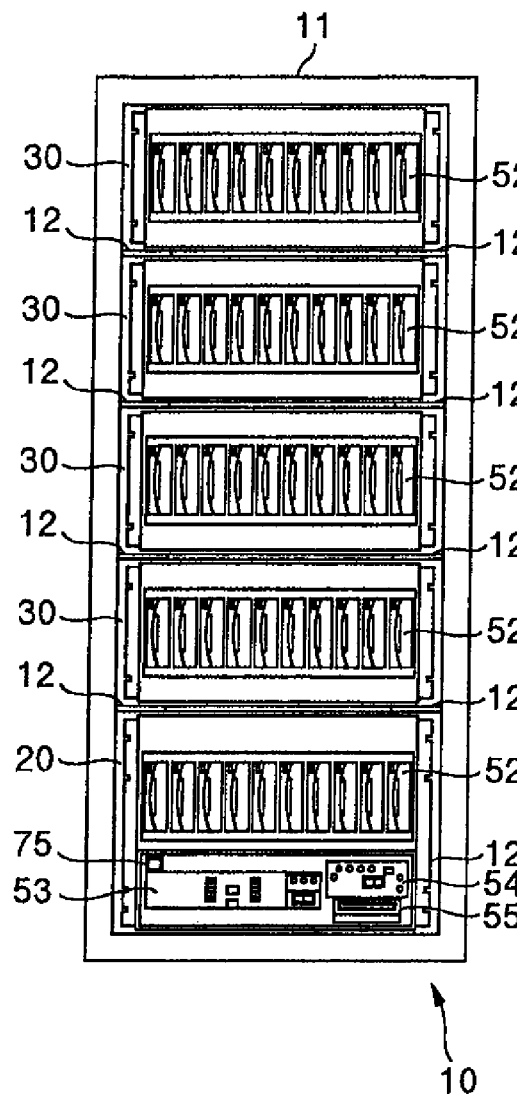
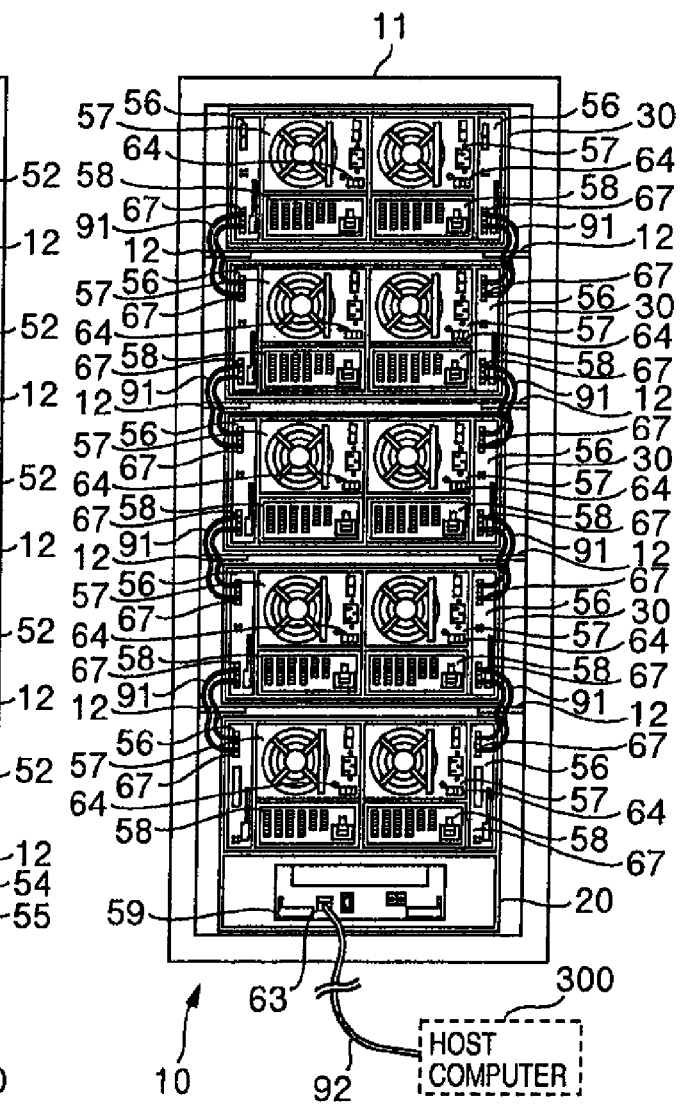

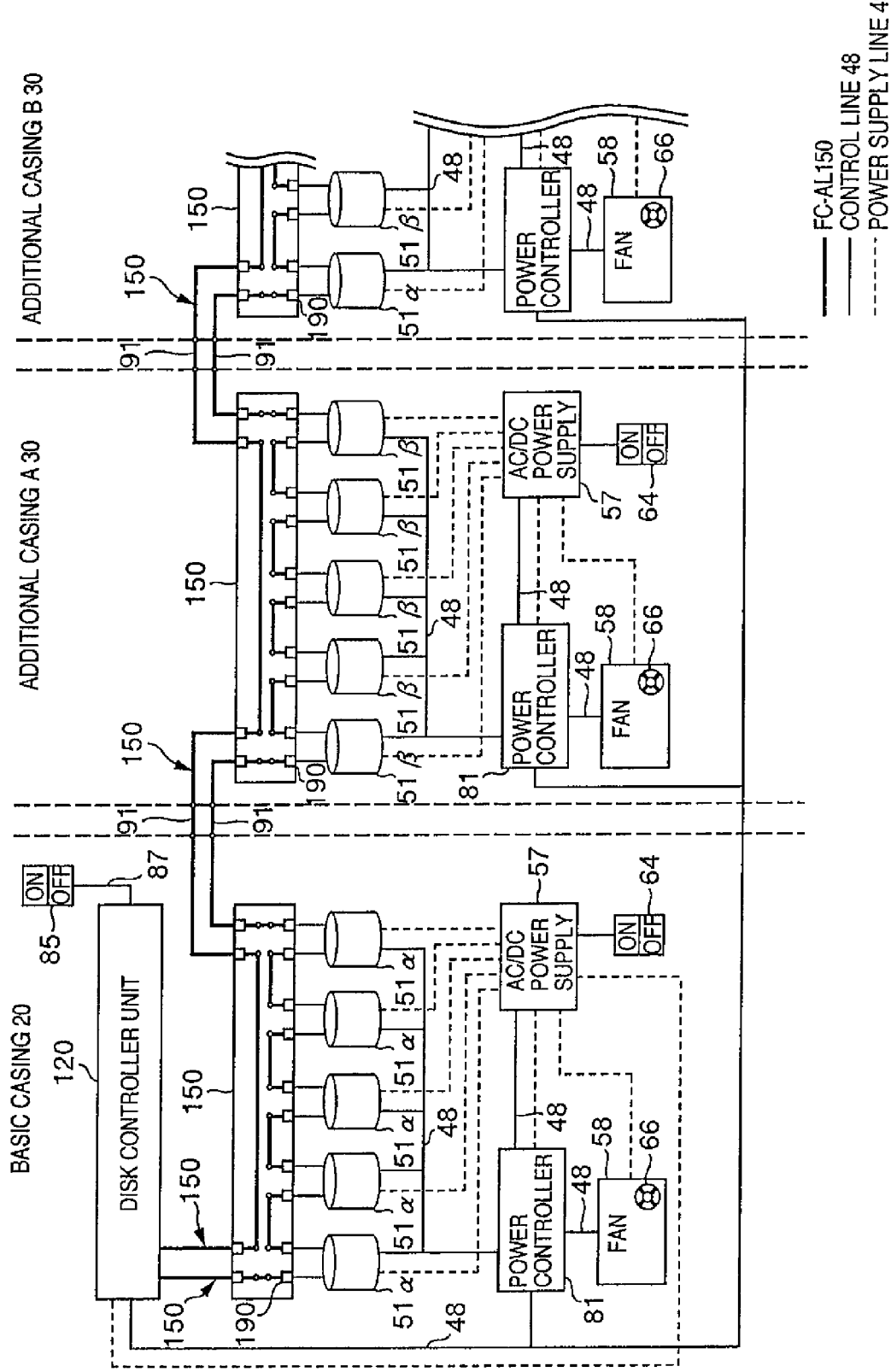

FIG.7

| OPERATION CHANGE OF DISK DRIVE AND COOLING FAN ||||
|---|---|---|---|
| CASING | DISK DRIVE | COMMUNICATION INTERFACE SCHEME OF DISK DRIVE | OPERATIONAL MODE CHANGE OF DISK DRIVE |
| BASIC CASING | #8 | FC | Ready ▼ |
| ADDITIONAL CASING A | #1 | SATA | Not Ready ▼ |
| ADDITIONAL CASING A | #2 | SATA | Ready<br>Not Ready<br>POWER OFF |
| ADDITIONAL CASING A | #3 | SATA | POWER OFF ▼ |
| ADDITIONAL CASING A | #2 | SATA | POWER OFF ▼ |
| ADDITIONAL CASING A | #3 | SATA | POWER OFF ▼ |

FIG.8

| CASING IDENTIFIER | DISK DRIVE IDENTIFIER | COMMUNICATION INTERFACE SCHEME OF DISK DRIVE | OPERATIONAL MODE |
|---|---|---|---|
| BASIC CASING | #1 | FC | Ready |
| | #2 | FC | Ready |
| | #3 | FC | Ready |
| | #4 | FC | Ready |
| | #5 | FC | Ready |
| | #6 | FC | Ready |
| | #7 | FC | Ready |
| | #8 | FC | Ready |
| ADDITIONAL CASING A | #1 | FC | Ready |
| | #2 | FC | Ready |
| | #3 | FC | Ready |
| | #4 | FC | Ready |
| | #5 | SATA | POWER OFF |
| | #6 | SATA | POWER OFF |
| | #7 | SATA | POWER OFF |
| | #8 | SATA | POWER OFF |
| ⋮ | ⋮ | ⋮ | ⋮ |

DISK ARRAY APPARATUS AND METHOD FOR CONTROLLING THE SAME

CROSS-REFERENCE TO RELATED APPLICATION

The present application is a continuation application of U.S. Ser. No. 11/056,005, filed Feb. 14, 2005 (now U.S. Pat. No. 7,523,258), which is a continuation of application Ser. No. 10/659,398, filed Sep. 11, 2003 (now U.S. Pat. No. 7,080, 201), and which claim priority to Japanese Patent Application No. 2003-145111, filed on May 22, 2003, the contents of which all of which are incorporated herein by reference in their entirety. This application is related to U.S. Ser. No. 11/056,007, filed Feb. 14, 2005 (now U.S. Pat. No. 7,587, 548), U.S. Ser. No. 11/056,006, filed Feb. 14, 2005 (now U.S. Pat. No. 7,461,203), U.S. Ser. No. 11/055,994, filed Feb. 14, 2005 (now abandoned), U.S. Ser. No. 11/056,002, filed Feb. 14, 2005 (now abandoned), U.S. Ser. No. 11/056,001, filed Feb. 14, 2005 (now abandoned), and U.S. Ser. No. 11/055, 968, filed Feb. 14, 2005 (now abandoned), all of which are continuation applications of U.S. Ser. No. 10/659,398, filed Sep. 11, 2003 (now U.S. Pat. No. 7,080,201) and the contents of all of which are incorporated herein by reference in their entirety.

BACKGROUND OF THE INVENTION

The present invention relates to a disk array apparatus and a method for controlling the disk array apparatus.

DESCRIPTION OF THE RELATED ART

The quantity of data to be processed by a computer system has been abruptly increased in these years. As a disk array apparatus for managing such a large quantity of data, there has recently come to public attention a large-scale disk array apparatus wherein a file system is coupled to a disk array apparatus of a RAID (Redundant Arrays of Inexpensive Disks) management type called mid-range class or enterprise class which offers a giant storage resource. For the purpose of efficiently using and managing such a giant amount of data, there has been developed a technique by which the disk array apparatus and an information processor are connected by means of a dedicated network (Storage Area Network, which will be referred to as the SAN, hereinafter) to realize high-speed, large-amount access to the disk array apparatus.

Meanwhile, in a related disk array apparatus, it has been common that only a disk drive having a specific type of communication interface is connected to one disk controller unit. On the recent market, however, there are available various types of disk drives which are different in their communication interface, access speed, etc., i.e., in Standard, price, etc. And from the viewpoint of the property, investment cost, etc. of a system to be operated, users' increasing need is to freely combine such disk drives to form a disk array system having a flexible arrangement. At the same time, another need is to utilize an existing disk array system more effectively by minimizing a modification in the arrangement of the existing disk array system while allowing the aforementioned flexible combination.

SUMMARY OF THE INVENTION

In view of such circumstances, it is therefore a major object of the present invention to provide a disk array apparatus which can respond to these needs, and also to provide a method for controlling such a disk array apparatus.

In accordance with an aspect of the present invention, the above object is attained by providing a disk array apparatus which includes a controller and a plurality of disk drives. The controller has a communication control unit for accepting a data input/output request, a disk controller unit for controlling a disk drive, and a cache memory for temporarily storing data transferred between the communication control unit and the disk controller unit. The plurality of disk drives have different communication interfaces and are connected to the disk controller unit to communicate with the disk controller unit.

In this case, the disk controller unit has at least functions of controlling the operations of the plurality of disk drives having different communication interfaces and monitoring the states or modes of the disk drives, which will be explained later. The communication interface is, for example, FC-AL (Fibre Channel Arbitrated Loop) interface, serial ATA interface, SCSI1 (Small Computer System Interface 1) interface, SCSI2 (Small Computer System Interface 2) interface, SCSI3 (Small Computer System Interface 3) interface, or ATA (AT Attachment) interface.

In this way, in the case of the disk array apparatus of the present invention, various types of disk drives having different communication interfaces, access speeds and storage capacities, i.e., different Standards, prices, etc. can be combined with one disk controller unit, and thus an existing disk array apparatus can be effectively used while minimizing a modification in the arrangement of the disk array apparatus.

Other objects and advantages of the present invention will become clear as the following description of the invention advances as detailed with reference to preferred embodiments of the invention as shown in accompanying drawings.

In accordance with the present invention, there can be provided a disk array apparatus wherein various types of disk drives different in their communication interface, access speed, etc., i.e., Standard, price, etc. can be freely combined with one disk controller unit, and thus an existing disk array apparatus can be effectively used while minimizing a modification in the arrangement of the disk array apparatus, and also can be provided a method for controlling the disk array apparatus.

BRIEF DESCRIPTION OF THE DRAWINGS

Preferred embodiments of the present invention will now be described in conjunction with the accompanying drawings, in which:

FIGS. 1A and 1B are front and back views showing an entire arrangement of a storage system in accordance with an embodiment of the present invention;

FIG. 6 is a circuit diagram of the disk array apparatus in the present embodiment;

FIG. 7 shows an example of a setting display screen in the present embodiment;

FIG. 8 shows an example of a disk drive management table in the present embodiment;

DESCRIPTION OF THE EMBODIMENTS

The present invention will be detailed in connection with embodiments of the invention with reference to the accompanying drawings.

1. Apparatus Arrangement

Figure 2A:
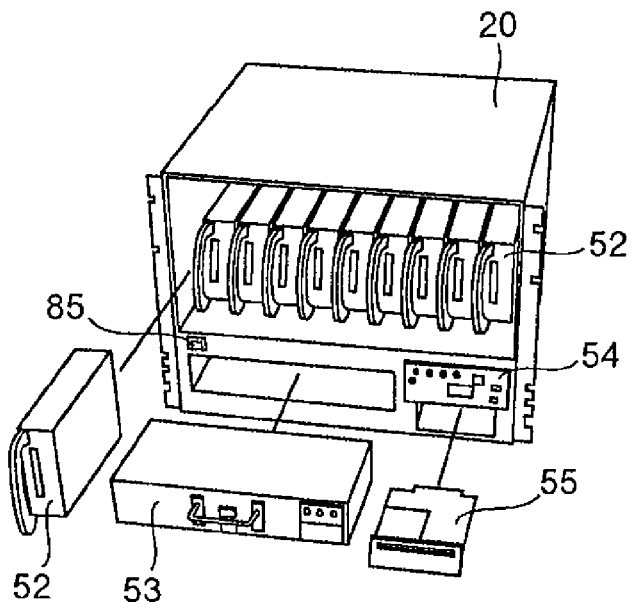
FIGS. 2A and 2B are exploded perspective views of a structure of a management terminal in the present embodiment.
Figure 2B:
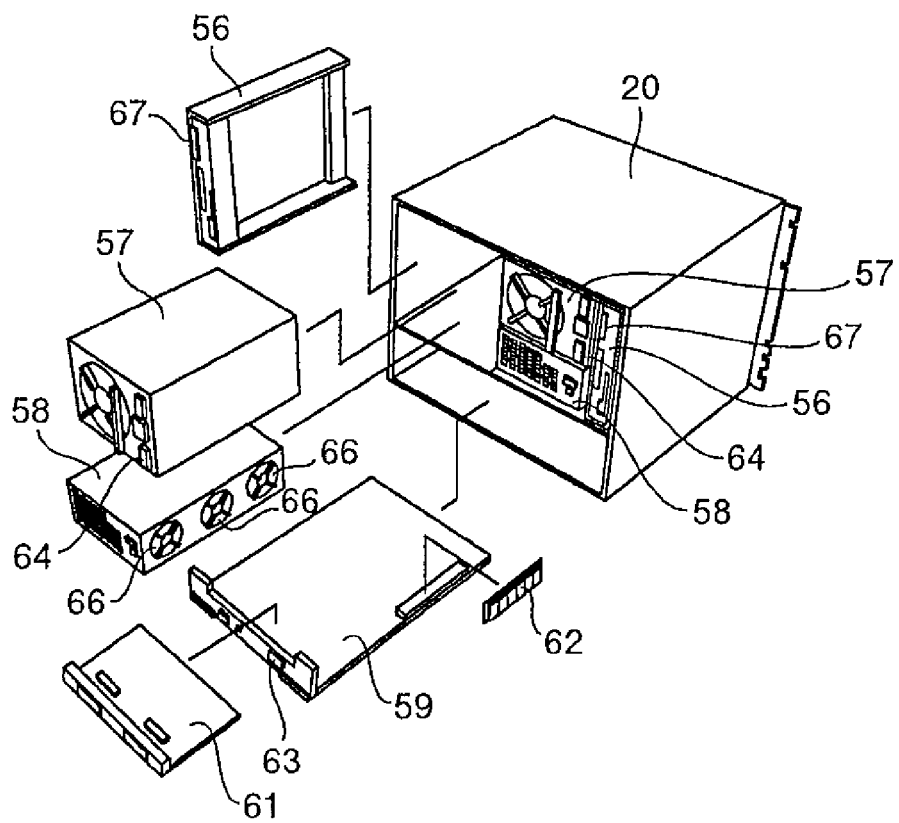
Figure 3A:
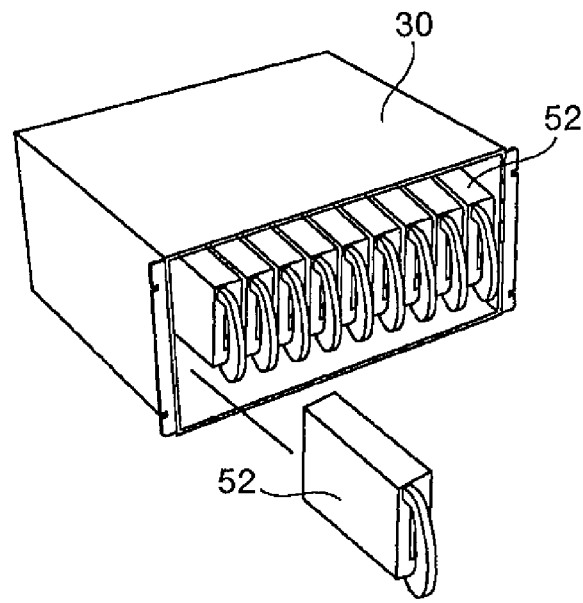
FIGS. 3A and 3B show exploded perspective views of a physical disk management table in the present embodiment.
Figure 3B:
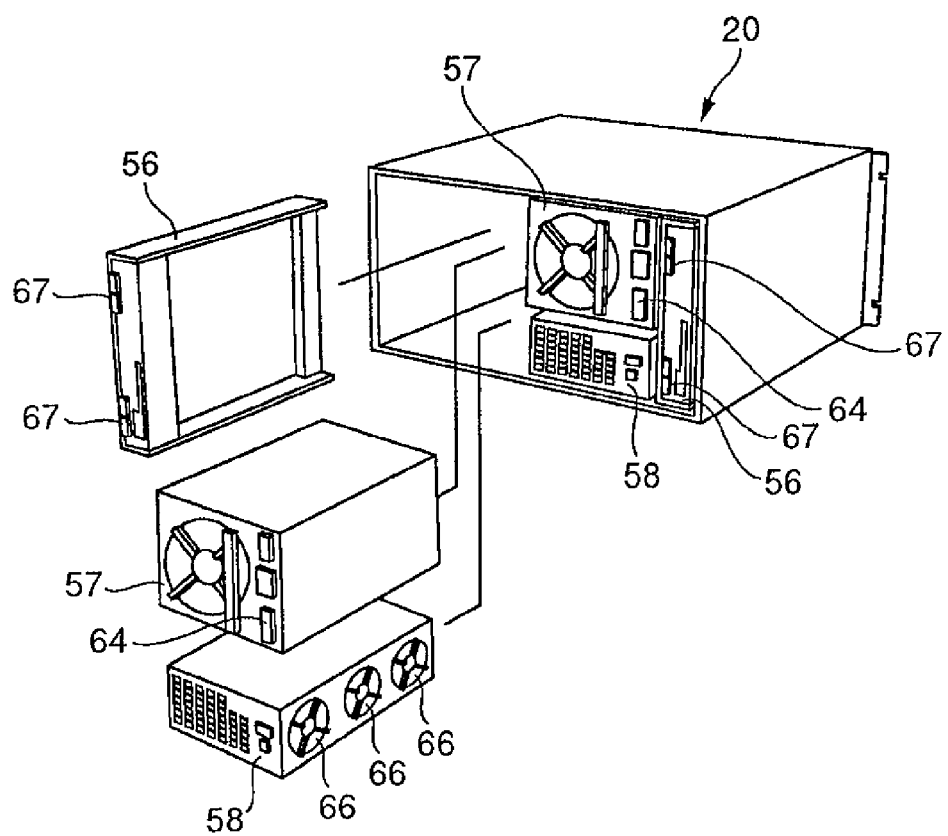

FIG. 1A is a front view of a disk array apparatus 10 to be explained in an embodiment of the present invention, FIG. 1B is a rear view of the disk array apparatus 10, FIG. 2A is a perspective view when viewed from the front side of a basic casing 20 mounted in the disk array apparatus 10, FIG. 2B is a perspective view when viewed from the rear side of the basic casing 20, FIG. 3A is a perspective view when viewed from the front side of an additional casing 30 to be mounted in the disk array apparatus 10, and FIG. 3B is a perspective view when viewed from the back side of the additional casing 30.

As shown in FIGS. 1A and 1B, the disk array apparatus 10 includes a rack frame 11 as its base. A plurality of stages of mount frames 12 are provided inside of left- and right-side inner surfaces of the rack frame 11 as arranged to be stacked in a vertical direction, each mount frame is formed in a back-and-front direction, and a basic casing 20 and additional casings 30 are mounted along the mount frames 12 to be drawn or inserted therein in a drawer-like manner. As shown in FIGS. 2A and 2B, boards and units for offering various types of functions to the disk array apparatus 10 are mounted in the basic casing 20 and additional casing 30.

As shown in FIG. 2A, a plurality of disk drive units 52 each having a disk drive 51 provided therein are mounted as arranged in a row on the front upper stage of the basic casing 20. In the present embodiment, the disk array apparatus 10 includes a plurality of disk drives 51 having different communication interfaces. The disk drive 51 is, e.g., of a type having a communication interface having a communication function based on FC-AL Standard, SCSI1 (Small Computer System Interface 1) Standard, SCSI2 Standard, SCSI3 Standard, ATA (AT Attachment) Standard, or serial ATA (Serial ATA: SATA) Standard.

A battery unit 53, a display panel 54 for displaying the operating mode, etc of the disk drive 51, and a flexible disk drive 55 are mounted on the front lower stage of the basic casing 20. A secondary battery is built in the battery unit 53. The battery unit 53 functions as a backup power source which supplies power to the board or unit when power supply from an AC/DC power supply 57 is interrupted due to a power failure or the like. Display devices including an LED indicator or lamp for indicating the operating mode of the disk drive 51 are provided on the display panel 54. The flexible disk drive 55 is used as when a maintenance program is loaded.

As shown in FIG. 2B, one power controller board 56 is mounted on each of both sides of the upper stage of the back side of the basic casing 20. The power controller board 56 is connected to communicate with the plurality of disk drives 51. The power controller board 56 and the plurality of disk drives 51 are connected by a loop communication line such as, e.g., a communication line based on the FC-AL scheme (topology) to communicate with each other.

Mounted on the power controller board 56 are a PBC (Port Bypass Circuit) 160 for controlling an FC-AL 150 formed between the disk drives 51 as well as a circuit for monitoring the states of the AC/DC power supply 57 and disk drives 51, for controlling power supply of the disk drives 51, for controlling the cooling capability of a cooling device, for controlling display devices on the display panel 54, and for monitoring the temperature of each casing. In this connection, the cooling device is a device for cooling the interior of the disk array apparatus 10 and the interiors of the casings 20 and 30, such as, e.g., an intercooler, a heat sink or an air-cooling type cooling fan.

A connector 67 for a fiber channel cable is provided to the power controller board 56, and a fiber channel cable 91 forming part of the line of the FC-AL 150 is connected to the connector 67. In this connection, the details of the FC-AL 150 is incorporated, for example, in JP-A-2001-167040 (corresponding to U.S. patent application Ser. No. 09/608,151), JP-A-2001-337868, or JP-A-2001-222385 (corresponding to U.S. patent application Ser. No. 09/758,684 published as U.S. Patent Application Publication US2001/0014956A1).

As shown in FIG. 2B, two of the AC/DC power supplies 57 are mounted side by side in a space defined by two of the power controller boards 56 on the back sides of the upper stage of the basic casing 20. The AC/DC power supplies 57 supply power to the disk drives 51, boards, unit, etc. The AC/DC power supplies 57 are connected to the power controller boards 56 to supply power to the respective disk drives 51 according to signals from the power controller boards 56.

For the purpose of getting security of the power supply of the respective casings 20 and 30, in the present embodiment, two of the power controller boards 56 and two of the AC/DC power supplies 57 have been redundantly mounted in the basic casing 20 and additional casing 30 respectively. However, each power controller board 56 and each AC/DC power supply 57 may be mounted to each of the casings.

A breaker switch 64 for turning ON and OFF the output of the AC/DC power supply 57 is provided to the AC/DC power supply 57.

As shown in FIG. 2B, two wind-assisted cooling fan units 58 are mounted side by side as located under the AC/DC power supplies 57 respectively. One or more cooling fans 66 are mounted in the wind-assisted cooling fan unit 58. The cooling fan 66 acts to supply air into the casing or discharge air therefrom to expel heat generated in the disk drives 51 or AC/DC power supply 57. In this case, the basic casing 20 and additional casing 30, and the boards and units mounted thereto are designed to be formed therein with ventilating passages or ports for circulation of air within the casings 20 and 30, enabling efficient discharging of heat within the casing 20 to the outside thereof by the cooling fans 66. Although the cooling fan 66 can be provided for each of the disk drives 51, it is preferable to provide a large cooling fan 66 for each casing because the necessary number of chips or units can be reduced.

The wind-assisted cooling fan unit 58 is connected to a control board 59 or wind-assisted cooling fan unit 58 by a control line 48 so that the control board 59 or power controller board 56 controls the rotational speed of the cooling fan 66 of the wind-assisted cooling fan unit 58 through the control line 48.

As shown in FIG. 2B, a single piece of control board 59 is mounted onto the lower stage of the back side of the basic casing 20. Mounted on the control board 59 are a communication interface with the disk drives 51 mounted in the basic casing 20 and additional casing 30, a circuit for controlling the operations of the disk drives 51 (e.g., based on a RAID scheme) or for monitoring the modes of the disk drives 51, and so on.

In the present embodiment, though the power controller board 56 is provided to control the power supply to the disk drives 51 and the cooling capability of the cooling device, such control may be carried out by the control board 59.

In the present embodiment, further, an interface board 61 having a communication interface function with a host computer 300 based on, e.g., the SCSI Standard or fiber channel Standard, a cache memory 62 for storing therein data to be written or read out to or from the disk drives 51, and so on are mounted on the control board 59. However, these elements may be mounted to another board.

Mounted to the interface board 61 mounted on the control board 59 is an external connector 63 which is based on a predetermined interface Standard of a fiber channel, a SAN (Storage Area Network) or LAN (Local Area Network) according to the protocol such as Ethernet (registered trademark), or SCSI for connection with the host computer 300. The host computer 300 is connected to the interface board 61 at the external connector 63 connected to a communication cable 92.

In this connection, for the purpose of getting security of control of the disk drives 51 of the basic casing 20, two of the control boards 59 may be redundantly mounted.

As shown in FIG. 3A, a plurality of disk drive units 52 having disk drives 51 accommodated therein are mounted in a row in the front side of the additional casing 30. As shown in FIG. 3B, the single power controller board 56 is mounted on each of right and left sides of the back of the additional casing 30. Also provided in a space defined by the two power controller boards 56 are two of the AC/DC power supplies 57 side by side. Two of the cooling fan units 58 are mounted under the AC/DC power supplies 57 side by side. The breaker switch 64 for turning ON or OFF the output of the associated AC/DC power supply 57 is provided to the associated AC/DC power supply 57.

As has been explained above, in the present embodiment, for the purpose of getting security of the power supply of the additional casing 30, the two power controller board 56 and the two AC/DC power supplies 57 are redundantly mounted in the additional casing 30 side by side each two. However, the single power controller board 56 and the single AC/DC power supply 57 can be mounted in the additional casing. Further, the functions of the power controller board 56 including the control of the power supply to the disk drives 51 and the control of the cooling capability of the cooling device may be provided to the control board 59.

Figure 4:
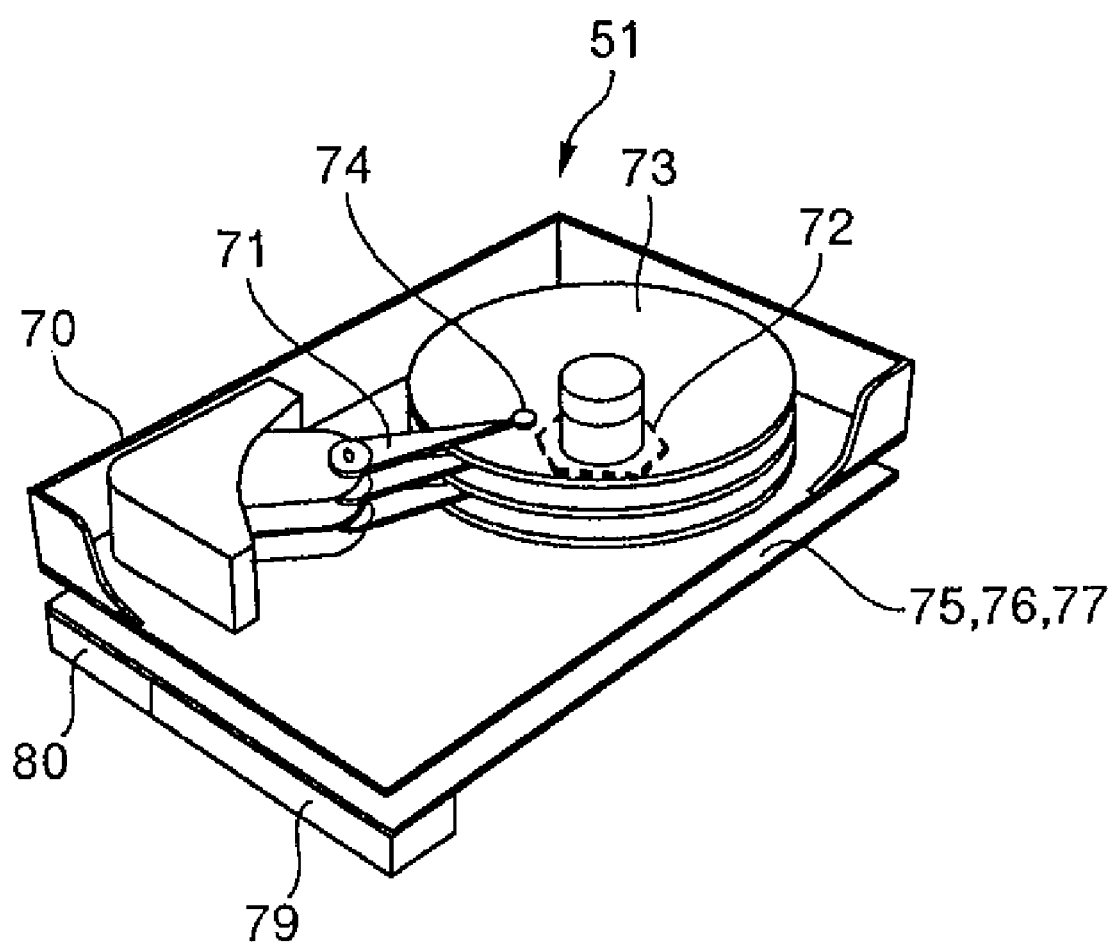
FIG. 4 is a perspective view of an LU management table in the present embodiment.

FIG. 4 shows an example of the structure of the disk drive 51 accommodated in the disk drive unit 52. The disk drive 51 includes a casing 70, a magnetic disk 73, an actuator 71, a spindle motor 72, a head 74 for reading or writing data, a mechanism control circuit 75 for controlling the mechanical part of the head 74, etc., a signal processing circuit 76 for controlling a data read/write signal to the magnetic disk 73, a communication interface circuit 77, an interface connector 79 through which various commands or data are input or output, a power connector 80, all accommodated in the casing 70.

The disk drive 51 is, for example, a 3.5-inch-sized magnetic disk of a contact start/stop (CSS) type or a 2.5-inch-sized magnetic disk of a load/unload type. The 3.5-inch magnetic disk has a communication interface based on, e.g., SCSI1, SCSI2, SCSI3 or FC-AL. The 2.5-inch magnetic disk, on the other hand, has a communication interface based on, e.g., serial ATA or ATA.

When the 2.5-inch magnetic disk is accommodated in the casing 20 or 30 of the disk array apparatus 10, it may be accommodated in a container having a 3.5 inch shape. With it, the shock resistance performance of the magnetic disk can be increased. In this connection, the 2.5- and 3.5-inch magnetic disks are different not only in their communication interface but also in the I/O performance, power consumption, life, etc. When compared with the 3.5-inch magnetic disk, the 2.5-inch magnetic disk has a bad I/O performance and a short life. When compared with the 3.5-inch magnetic disk, however, the 2.5-inch magnetic disk is superior thereto in that it has less power consumption.

2. Hardware Arrangement of Disk Array Apparatus

Figure 5:
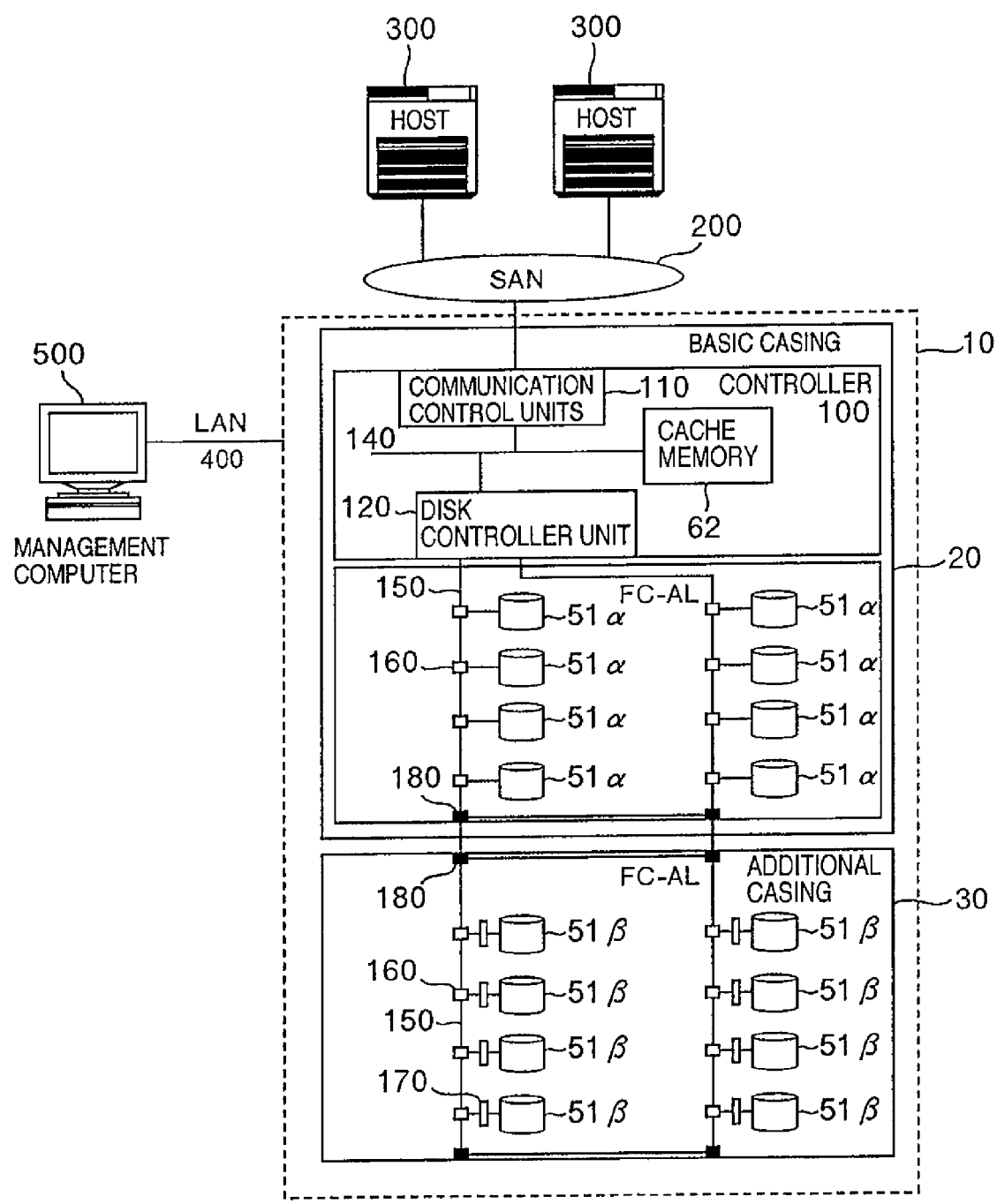
FIG. 5 shows an exemplary hardware arrangement of a disk array apparatus in the present embodiment.

FIG. 5 is a block diagram of a hardware arrangement of the disk array apparatus 10 for explaining it as an embodiment of the present invention.

As shown in FIG. 5, the disk array apparatus 10 is connected with the host computer 300 via a SAN 200, and also connected with a management computer 500 via a LAN 400. The host computer 300 is an apparatus which accesses the disk array apparatus 10, such as a personal computer, a work station or a mainframe computer. The management computer 500, which is a computer for operating and managing the disk array apparatus 10, is connected to the disk array apparatus 10 via the LAN (Local Area Network) 400. The LAN 400 is a network which is connected between the disk array apparatus 10 and management computer 500 to perform communicating operation based on a protocol such as, e.g., TCP/IP. In this connection, it is not necessarily required that the management computer 500 be connected by a communication means such as the LAN 400, but the management computer 500 may be connected by means of a communication line or bus line based on the SCSI (Small Computer System Interface) Standard or in a peer-to-peer relationship.

The disk array apparatus 10, which is managed, e.g., by a system center, data center or the like in a company or corporation, functions as an apparatus for previously storing data to be processed by the host computer 300. The host computer 300 in turn is a computer which offers such a service as, e.g., an automatic deposit/payment service in a bank or a homepage browsing service in the Internet.

The disk array apparatus 10 and host computer 300 are connected by the SAN 200. The SAN 200 is a network which is connected between the disk array apparatus 10 and host computer 300 to communicate with each other according to, e.g., a fiber channel protocol.

<Disk Array Apparatus>

The disk array apparatus 10 is a computer having a CPU (Central Processing Unit) and a memory. When various programs are executed under control of the CPU of the disk array apparatus 10, various functions can be implemented. The disk array apparatus 10 performs control over disk drives $51\alpha$ and $51\beta$ according to a command received from the host computer 300. For example, when receiving an input/output request of data sent from the host computer 300, the apparatus perform performs data input/output operation over the disk drives $51\alpha$ and $51\beta$. The data is stored in a logical volume as a storage area logically set on physical storage areas provided by the disk drives $51\alpha$ and $51\beta$ of the disk array apparatus 10. The disk array apparatus 10 also sends or receives various commands to and from the host computer 300 to manage the disk array apparatus 10.

The disk array apparatus 10 includes the basic casing 20 and one or more of the additional casings 30, as has already been explained. In the present embodiment, the basic casing 20 has a controller 100, disk drives 51α, an FC-AL 150, port bypass switches 160, and terminals 180. The controller 100 has a communication control unit 110, a disk controller unit 120, a cache memory 62, and a bus 140. The controller 100 is mounted on the above control board 59. The additional casing 30 has disk drives 51β, an FC-AL 150, port bypass switches 160, converters 170 and terminals 180.

The communication control unit 110 has an interface for communication with the host computer 300. The interface of the communication control unit 110 is, for example, a host bus adaptor (HBA) which connects the disk array apparatus 10 to the SAN 200. As a result, the disk array apparatus 10 can transmit or receive various data input/output commands or data to or from the host computer 300. The interface of the communication control unit 110 is such a communication interface board 61 as mentioned above.

The bus 140 is wired between the communication control unit 110, disk controller unit 120 and cache memory 62 to mutually connect these. Data transfer between the communication control unit 110, disk controller unit 120 and cache memory 62 is carried out via the bus 140.

The cache memory 62 is a memory element to be used by the communication control unit 110 and disk controller unit 120. The cache memory 62 is used to temporarily store data transferred between the communication control unit 110 and disk controller unit 120. Since the communication control unit 110 or disk controller unit 120 uses the cache memory 62, the data writing or reading operation can be efficiently carried out.

The terminal 180 provided to the basic casing 20 or additional casing 30 is a metal fitting which connects together a connection line in the basic casing 20 and a connection line in the additional casing 30. Data or command transfer between the disk controller unit 120 of the basic casing 20 and the disk drive 51β accommodated in the additional casing 30 is carried out via the terminals 180.

The disk controller unit 120 executes operations of writing or reading out data in or from the disk drives 51α and 51β in response to a data input/output request from the communication control unit 110. The disk controller unit 120 writes data read out from the disk drives 51α and 51β in the cache memory 62. Further, the disk controller unit 120 acquires data written in the cache memory 62 by the communication control unit 110 and writes it in the disk drives 51α and 51β.

The disk controller unit 120 may have such a function as to control the disk drives 51α and 51β at a so-called RAID (Redundant Array of Inexpensive Disks) level (e.g., 0, 1, 5) prescribed in the so-called RAID system.

Further, the disk controller unit 120 may perform management control of a copy of data stored in the disk drives 51α and 51β or backup control thereof.

In addition, for the purpose of preventing data disappearance or loss due to occurrence of a disaster (disaster recovery), the disk controller unit 120 may have a function (data replication function (remote copy)) of storing a copy of data of the disk array apparatus 10 at a primary site also in another disk array apparatus installed at a secondary site.

The FC-AL 150, which is one of fiber channel systems (topologies), acts to connect the disk controller unit 120 and disk drives 51α and 51β by a loop-like connection line (transmission line) to communicate with each other. In this connection, the disk controller unit 120 and disk drives 51α and 51β may be communicably connected with each other by means of an FC-AL hub or directly by a connection line such as a fiber channel cable.

The FC-AL 150 has a plurality of port bypass switches (PBC's) 160. The PBC 160 has a main function of connecting the disk controller unit 120 and a plurality of disk drives 51α and 51β by the FC-AL 150. The PBC 160, which is an electronic switch in the form of a chip, also has a function of bypassing the disk controller unit 120 and disk drives 51α and 51β to electrically remove the disk controller unit and disk drives 51α and 51β from the FC-AL 150. More specifically, the PBC 160 separates the disk drive 51, which became faulty, from the FC-AL 150 thus enabling communication between another disk drive 51 and disk controller unit 120.

The PBC 160 also enables insertion and removal of the disk drive 51 with such a condition that the operation of the FC-AL 150 remains. For example, when the disk drive 51 is newly mounted, the disk drive 51 is incorporated into the FC-AL 150 to enable communication with the disk controller unit 120. In this connection, the circuit board of the PBC's 160 may be provided to the rack frame 11 of the disk array apparatus 10, or all or some of the PBC's may be mounted to the control board 59 or power controller board 56.

Accommodated in the disk array apparatus 10 are the plurality of disk drives 51α and 51β having different communication interfaces (different communication Standards) for communication with the disk controller unit 120. The communication Standards of the communication interfaces possessed by the disk drives 51α and 51β include, for example, fiber channel (FC), SCSI1 (Small Computer System Interface 1), SCSI2, SCSI3, ATA (AT Attachment) and Serial ATA (SATA). In the present embodiment, the disk drives 51α have a fiber channel interface and the disk drives 51β have an SATA interface. However, the present invention is not limited to the specific example.

The converter 170 is a device which converts data or signal to make the communication interface not adapted to the communication scheme of the communication line with the disk controller unit 120 confirm to the aforementioned communication scheme. The converter 170 is, for example, an SCSI-ATA (IDE: Integrated Device Electronics) converter, an FC-SATA converter, or an ATA (IDE)-SATA converter. When the disk drive 51β is connected to the FC-AL via the converter 170, the disk drive 51β can communicate with the disk controller unit 120. The converter 170 may also be provided in such a form as to be built in the disk drive 51β, or may also be provided in such a form as to be installed outside of the disk drive 51β.

<Management Computer>

The management computer 500 is a computer for maintaining and managing the disk array apparatus 10 connected thereto by the LAN 400. The management computer 500 is, for example, a personal computer, a workstation, a mainframe computer or the like.

The management computer 500 has a CPU, a memory and so on, and the CPU of the management computer 500 performs general control over the management computer 500 in such a manner that the computer realizes various functions by executing various programs stored in the memory.

When the operator operates the management computer 500, for example, he can set the arrangements of the disk drives 51α and 51β, manage or set logical volumes (capacity management, capacity extension or reduction, assignment of the host computer 300, etc.), and so on. As an example of setting the arrangements of the disk drives, addition or reduction of the number of disk drives 51α and 51β or modification of the RAID configuration (e.g., modification from RAID1 to RAID5) can be carried out. Further, the confirmation of the operating mode of the disk array apparatus 10 or the identification of a fault location can also be done. These settings are realized by the operator who uses the Web page offered by the Web server operated by the management computer 500 as a user interface. The management computer 500 may also be provided in such a form as to be built in the disk array apparatus 10 or in such a form as to be installed outside thereof.

The management computer 500 may be used as a computer for exclusive maintenance and management of the disk array apparatus 10 and disk drives 51α and 51β, or such maintenance/management functions may be provided to a general purpose computer.

From the above reasons, in the case of the disk array apparatus 10 of the present invention, various types of disk drives different in communication interface, access speed, storage capacity and price can be freely combined with the single disk controller unit, and modification in the arrangement of an existing disk array apparatus can be minimized and thus the existing apparatus can be effectively used.

3. Circuit Configuration

In such a condition that the basic casing 20 and additional casing 30 are mounted in the rack frame 11, the boards and units mounted in these casings 20 and 30 are wired by internal wiring lines or circuits (not shown) provided to the rack frame 11 or by external wiring lines to thereby establish such a circuit as shown in FIG. 6. In this drawing, thick lines indicate the FC-AL's 150, thin lines indicate the control lines 48, and dashed lines indicate power supply lines 49, respectively. Provided on the FC-AL's 150 are terminals (e.g., connectors) 190 for connection with the disk drives 51α and 51β and the boards and units of the disk controller unit 120. The disk controller unit 120 is provided in the form of a circuit including a CPU, a protocol control chip, memories such as RAM and ROM and mounted on the control board 59; and functions to control and monitor the disk drives 51α and 51β mounted in the basic casing 20 and additional casings A and B (30).

A main switch 85 is provided, e.g., on the front side of the basic casing 20, so that, when the control board 59 is mounted to the basic casing 20 for example, an output signal line 87 of the main switch 85 is connected to the disk controller unit 120. In this connection, the main switch 85 may also be provided to the rack frame 11, in which case, the basic casing 20 is mounted to the rack frame 11. For this reason, the output signal line 87 can also be connected to the disk controller unit 120.

A power controller 81 is mounted on the power controller board 56. The power controller 81 has memories such as CPU, RAM and ROM and also has various types of control chips. The power controller 81 has wiring lines connected to the wind-assisted cooling fan unit 58 and AC/DC power supply 57. The power controller 81 controls and monitors such boards and units mounted in the basic casing 20 and additional casings A and B (30) as the wind-assisted cooling fan unit 58, AC/DC power supply 57 and disk drives 51α and 51β.

The power controller 81 for each of the casings 20 and 30 is connected directly to the disk controller unit 120 via the control line 48. The power controller 81 may also be connected to the disk controller unit 120 via an SES drive to be explained later.

The power controller 81, in response to a power supply signal or power cut-off signal of the disk drives 51α and 51β received from the disk controller unit 120, transmits to the AC/DC power supply 5 a signal indicative of power supply to the respective disk drives 51α and 51β or a signal indicative of power cut-off to the disk drives 51α and 51β. As a result, the AC/DC power supply 57 can supply power to the disk drives 51α and 51β or can stop power supply thereto.

At the same time, according to the operating modes of the disk drives 51α and 51β accommodated in the casings, the power controller 81 controls the rotational speed of the cooling fan 66. In this connection, the control of the rotational speed of the cooling fan 66 may be carried out in units of each of the disk drives 51α and 51β or in units of each casing. The control of the rotational speed of the cooling fan enables reduction of power consumption of the apparatus. Further, since the rotational speed of the cooling fan is controlled depending on the operating modes of the disk drives 51α and 51β, the present disk array apparatus can realize noise prevention more effectively than a disk array apparatus not for controlling the rotational speed.

4. Operation

<Operating Mode of Disk Drive>

The disk drive 51, when receiving a command from the disk controller unit 120, is switched to any one of operating modes of "ready", "not ready" and "power off". The disk drive 51 operating in the "ready" mode can accept read/write command of data sent from the disk controller unit 120. The disk 73 of the disk drive 51 operating in the "ready" mode is rotating with a rotational speed necessary for data reading/writing (spin up state). The average power consumption of the disk drive 51 becomes maximum when the disk drive is operating in the "ready" of the above three modes.

When the disk drive 51 is operating in the "not ready" mode, the disk drive 51 is not rotating with a rotational speed necessary for the data reading/wring (spin down state). The disk drive 51 operating in the "not ready" mode cannot accept a command relating to the data reading/writing, but can accept a specific type of command such as, e.g., a command indicative of shift to the "ready" mode. The average power consumption of the disk drive 51 operating in the "not ready" mode is less than that in the "ready" mode.

When the disk drive 51 is in the "power off" mode, the disk drive 51 cannot accept a command sent from the disk controller unit 120. Further, the rotation of the disk 73 of the disk drive 51 is completely stopped. The average power consumption of the disk drive 51 is zero in the "power off" mode.

The aforementioned operating mode of the disk drive 51 can be changed, for example, by an operator who operates a setting display screen presented by a software program run by the management computer 500. An example of such setting screen is shown in FIG. 7. Since the operating mode of each of the disk drives 51 can be controlled on the setting screen, the operation and management of the apparatus can be improved.

The scheme of the communication interface of the disk drive 51 in FIG. 7 can be acquired by the following method. That is, when the disk controller unit 120 inquires the disk drive 51 accommodated in the basic casing 20 and additional casing 30 via the FC-AL 150 (e.g., by polling), the disk controller unit can know the scheme (standard) of the communication interface of the each disk drive 51. For example, when a command is sent to the each disk drive 51, the type of the communication interface scheme is set to be informed from the disk drive 51. The disk controller unit 120 stores the type of the communication interface Standard informed from the disk drive 51 in a disk drive management table as associated with the corresponding disk drive 51. The disk drive management table is stored, for example, in the memory or the disk drive 51. FIG. 8 shows an example of the disk drive management table. Recorded in the disk drive management table are identifiers of the disk drives 51 accommodated in each casing, communication interface schemes of the disk drives 51, and operating modes of the disk drives 51. In this connection, the above inquiry may be carried out when the disk array apparatus 10 is operated or when the user mounts the disk drive 51 in the casing 20 or 30.

With it, the disk controller unit 120 can control the operating mode of each disk drive. Further, the disk controller unit 120 can also control such operating mode in units of a group of disk drives or in units of casing. As a result, the disk drives can be grouped according to their usage purpose to form groups of drives or a casing for exclusive backup or fix contents which can temporarily save power. For example, such drives having a short life as SATA drives can be used as drives exclusively for backup or fix contents, such drives can be collectively controlled so that the drives are put in the "power off" mode when not used or are operated in the "ready" mode as necessary. As a result, not only the use power can be reduced but also the life of the drives can be unified and the average life of the drives can be secured, thus increasing its maintenance efficiency. Furthermore, since the operating modes of the disk drives can be controlled in units of disk drive group, the operation and management of the apparatus can also be improved.

<SES Drive>

Figure 9:
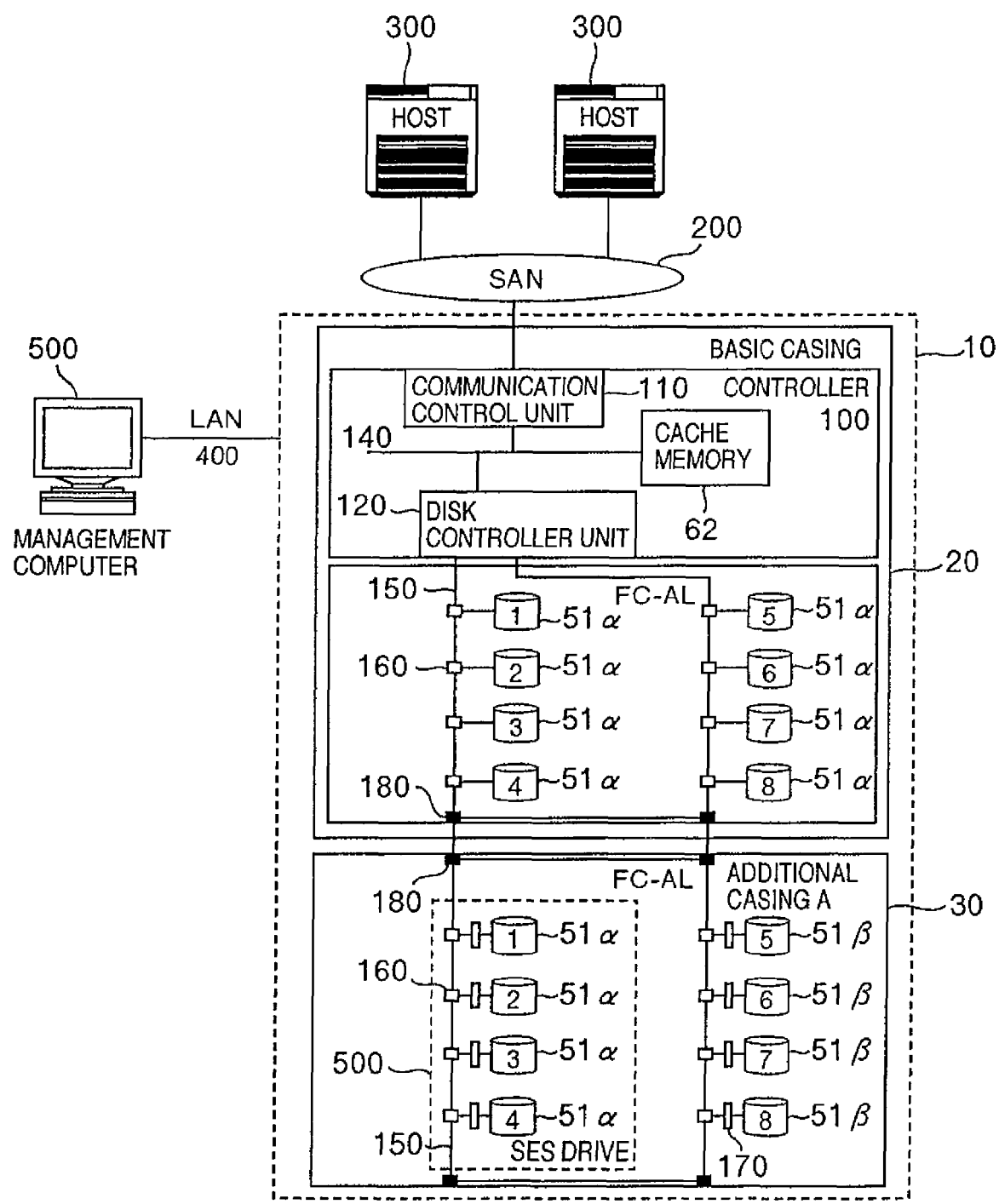
FIG. 9 shows an exemplary of a hardware arrangement of the present embodiment used as an SES drive.

Shown in FIG. 9 is an example when the disk drives 1 to 4 (51α) of the additional casing A 30 are used as SES drives. In the present embodiment, it is assumed that the power controller 81 and disk controller unit 120 are connected by the SES drives. The word "SES (SCSI Enclosure Services) drive" refers to such a disk drive 51 that causes the disk controller unit 120 and the power controller 81 for control of the power supply of the disk drive 51 to be connected to each other communicably with each other.

The SES drive has an SES (SCSI Enclosure Services) or ESI (Enclosure Service I/F) prescribed in SCSI3 (Small Computer System Interface 3) Standard. And the SES or ESI function can be activated by connecting predetermined signal pins of the interface connector 79.

In the present embodiment, the disk drives 1 to 4 (51α) of the additional casing A 30, i.e., FC drives are employed as SES drives as shown in FIG. 9, but the disk drives 51 having another communication interface may be used as the SES drives. Further, one or a plurality of disk drives 51 may be used as SES drives. In the present embodiment, the disk drives 5 to 8 (51β) of the additional casing A 30 as shown in FIG. 9 are of a SATA type.

In this way, since the SES function is provided to the specific disk drive(s) 51, the need for provision of the control line 48 for connection between the disk controller unit 120 and power controller 81 can be eliminated. Further, The disk controller unit 120 can control the operating mode of another disk drive via the SES drive.

When the SES drives are fixed to certain specific disk drives 51 as mentioned above, the life of the disk drives 51 can be shortened remarkably. To avoid this, it is considered to operate as rotationally shifted the disk drives 51 functioning as the SES drives. By operating the disk drives 51 as rotationally shifted in this way, the life of the SES drives can be prolonged. Explanation will next be made as to the rotational shift use of the SES drives.

<Rotational Shift of SES Drives>

Figure 10:
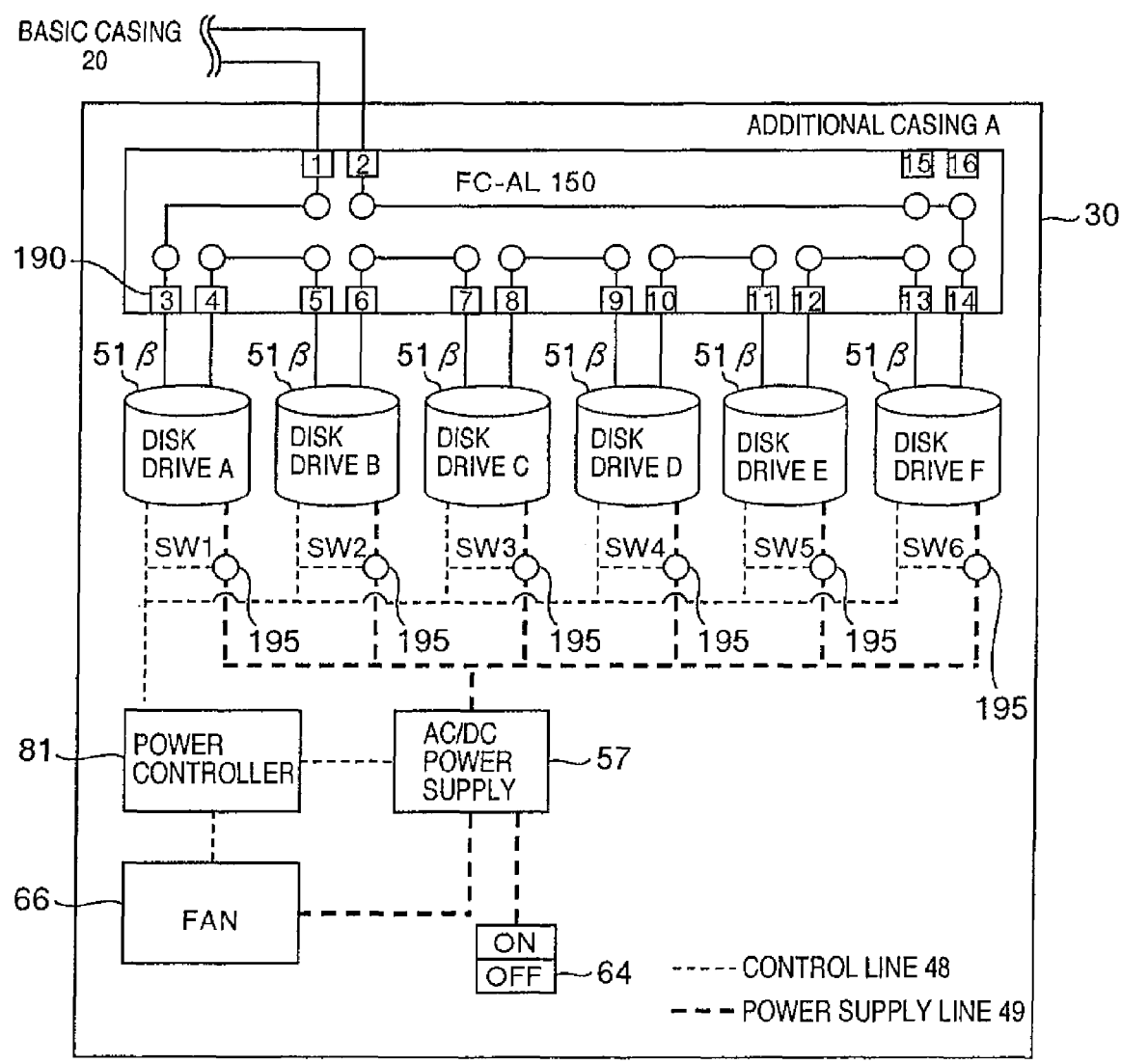
FIG. 10 shows a circuit configuration of an additional casing A 30 which accommodates only a SATA drive in the present embodiment.

Explanation will be made as to a mechanism wherein SES drives in the additional casing A 30 having the SATA drives alone housed therein are shifted by rotation under control of a software program, by referring to FIG. 10. The drawing shows a circuit configuration of the additional casing A 30 having the SATA disk drives (disk drive A to F) (51β) housed therein.

A signal for control of power or the like is applied to a terminal 1 (190) from the basic casing 20 via the FC-AL 150. The signal arrives at the power controller 81 via a terminal 3 (190), SES drive (SATA drive A) 51β and control line 48. At this time, since the SATA drive A (51β) is operating in the "ready" or "not ready" mode, the signal for control of power or the like can arrive at the power controller 81 via the disk drive A (51β).

The power controller 81, when receiving the power control signal from the basic casing 20, controls the power supply to the power fan, the rotational speed of the fan, etc. In this case, it is assumed that power is already supplied to the SATA drive A (51β), power controller 81 and cooling fan 66 in an initial state. Further the cooling fan 66 is operating in a low-power-consumption mode.

When receiving a signal from the basic casing 20 to the additional casing 30 to put the respective disk drives 51β in the "ready" mode, the power controller 81 changes the rotational speed of the cooling fan 66 to a value in its normal operation and controls switches SW2 to SW6 (195) to start power supply to the SATA drives B-F (51β).

Figure 11:
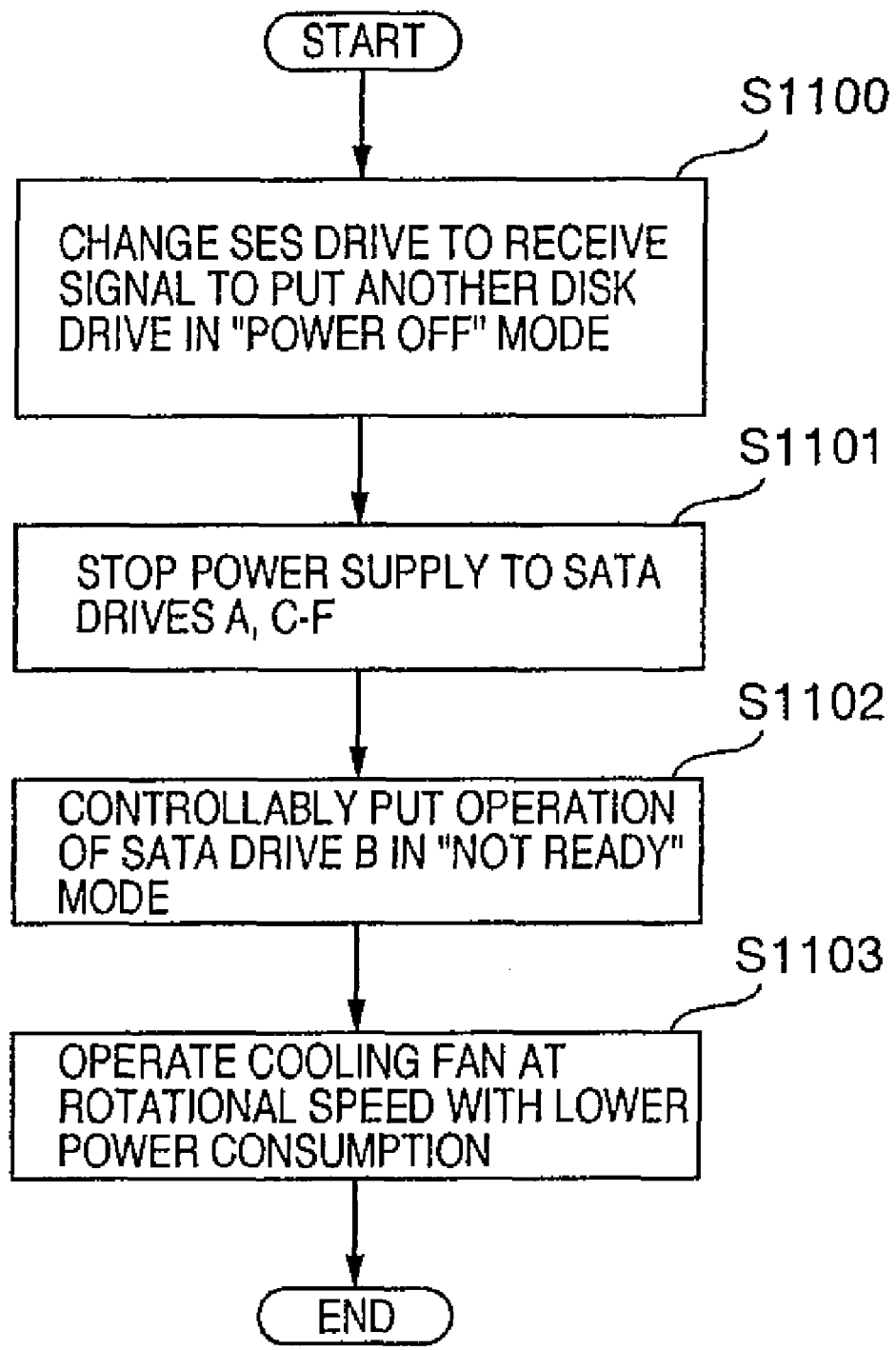
FIG. 11 is a flow chart for explaining the exchanging operation of the SES drive in the present embodiment.

Explanation will next be made as to how the power controller 81 changes the SES drive from the SATA drive A (51β) to the SATA drive B (51β). FIG. 11 shows an example of a SES drive changing procedure. As shown in FIG. 11, when receiving a signal from the basic casing 20 to change the SES drive to another disk drive 51β and to put the latter drive in the "power off" mode (S1100), the power controller 81 controls the switches SW1 and SW3 to SW6 (195) to stop power supply to the SATA drive A (51β) and to the SATA drives C-F (51β) (S1101). Thereafter, the operation of the SATA drive B is controlled to be in the "not ready" mode (S1102) and the rotational speed of the cooling fan 66 is operated in the low-power-consumption mode (S1103), whereby the additional casing 30 is put in the "power off" mode (low-power-consumption operational mode). Next, when a signal for control of power or the like comes from the basic casing 20, the signal is transmitted to the power controller 81 via the SATA drive B (51β).

In this connection, the apparatus is designed so that, in response to operator's instruction, the signal indicative of the change of the SES drive to be received by the power controller 81 can be transmitted to the power controller 81 from the basic casing 20, but the signal can also be transmitted from the basic casing 20 at the timing set by the user.

As mentioned above, when the power controller 81 receives the signal indicative of change of the SES drive from the basic casing 20, the SES drive is changed from the SATA drive A (51β) to the SATA drive B (51β). As the SES drive changing operation is carried out sequentially from the SATA drive A (51β) to another SATA drive (51β), the SES drive is sequentially changed. Since the SES drive is sequentially changed in this way, the lives of the disk drives 51β can be made equal to each other. However, the method of shifting the SES drive by rotation is not limited to the above specific method, but another method can be considered readily by those skilled in the art in the form of a circuit configuration or the like.

<Basic Operation of Disk Array Apparatus>

Since the disk controller unit 120 communicates with the disk drive 51 housed in the basic casing 20 and additional casing A 30 via the FC-AL 150, the disk controller unit 120 can know whether disk drive 51 is in any of the modes "ready", "not ready" and "power off". Further, the disk controller unit 120 transmits a command to the disk drive 51 to control the operation of the disk drive 51. In this connection, the communication for the mode grasp and control is carried out according to a protocol such as FC-AL or FCP (Fiber Channel Protocol for SCSI). The disk controller unit 120 also controls the cooling ability of the cooling fan 66 according to the operational mode of the disk drive unit 52.

Such control is carried out, for example, when the user wants to change the operational mode of a specific disk drive 51 on such a setting display screen as shown in FIG. 7 or when a data write/read request is issued from the host computer 300 to the disk drive 51 in the "power off" mode. Such control is also carried out even when data stored in the disk drive 51 (put in the "ready" mode) is to be stored in the disk drive 51 (in the "power off" mode) for exclusive backup in response to user's instruction or the like. Explanation will be made below in connection with an example of a processing sequence wherein, in response to user's backup instruction or the like, how the operation of the disk drive 51 and the cooling ability of the cooling device are controlled.

Figure 12:
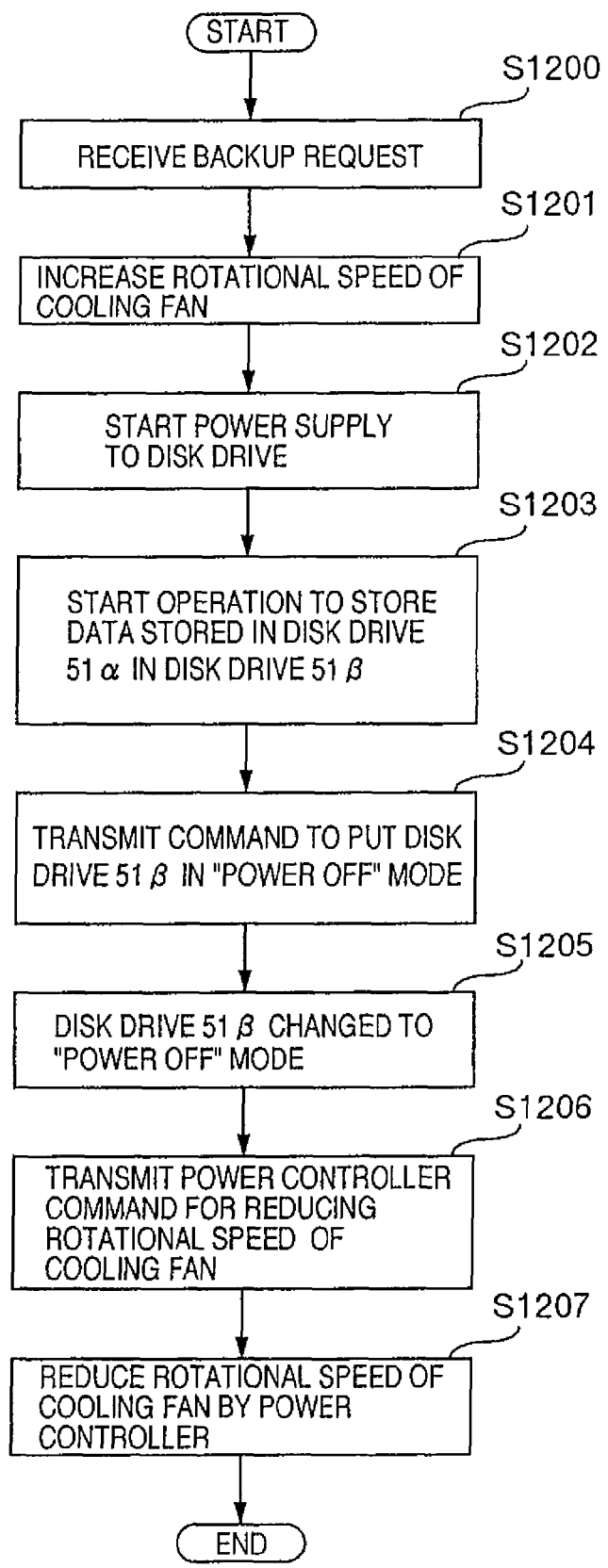
FIG. 12 is a flow chart for explaining a processing sequence of control of the operation of the disk drive and the cooling capability of a cooling fan 66 in the present embodiment.

FIG. 12 shows a flow chart for explaining a processing sequence to control the operation of the disk drive and the cooling ability of the cooling fan 66.

The management computer 500 first transmits a backup request to the disk array apparatus 10 via the LAN 400 for backup. The disk array apparatus 10, when receiving the backup request, refers to the disk drive management table stored in the memory or disk drive 51, confirms the operational mode of the disk drive 51β as a backup destination, and starts its backup operation. In this case, it is assumed in its initial state that the disk drive 51β housed in the additional casing A 30 is put in the "power off" mode and the cooling fan 66 is operating in the "low-power-consumption" mode. It is also assumed that the disk drive 51α housed in the basic casing 20 is put in the "ready" mode and the cooling fan 66 is operated in the normal mode.

When the disk array apparatus 10 receives the backup request (S1200), the apparatus transmits a command to the power controller 81 of the additional casing A 30 via the control line 48 to increase the rotational speed of the cooling fan 66. The power controller 81, when receiving the signal, increase the rotational speed of the cooling fan 66 (S1201). Further, the rotational speed of the cooling fan 66 at this stage may be previously increased to a level necessary for dissipation of heat to be generated when the disk drive 51β specified by the operator is put eventually in the "ready" mode. Thereby, the operation of the disk drive 51β is shifted to the "ready" mode faster than the increase of the rotational speed of the cooling fan 66, thus preventing the temperature increase within the casing. Also the rotational speed of the cooling fan 66 may be gradually increased depending on the rising condition of the disk drives 51β specified by the operator. When it is desired to adjust not the rotational speed but the number of driven cooling fans 66, it is also possible to gradually increase the number of cooling fan 66 to be driven according to the rising condition of the disk drive 51β. In this way, since the cooling fans 66 can be driven in a condition sufficient in the then circumstances, power saving and noise reduction can be realized more effectively.

The disk controller unit 120 then transmits a command to the power controller 81 via the control line 48 to instruct the power controller 81 to start power supply to the disk drive 51β specified by the operator. The power controller 81, when receiving the command, controls the AC/DC power supply 57 to start the power supply to the disk drive 51β specified by the operator (S1202). As result, the disk drive 51β is shifted from the "not ready" mode to the "ready" mode.

The disk controller unit 120 is monitoring the operational state of the disk drive 51β by inquiry (e.g., by polling) via the control line 48. And as soon as the disk controller unit 120 recognizes the fact that the disk drive 51β was put in such a condition as able to read or write data, the disk controller unit starts operation of causing the data stored in the disk drive 51α specified by the operator to be stored in the associated disk drive 51β (S1203). When the disk controller unit 120 recognize the end of the above operation, the disk controller unit transmits a command to the disk drive 51β via the control line 48 to shift the disk drive 51β from the "ready" mode to the "power off" mode (S1204). As a result, the disk drive 51β is put in the "power off" mode (S1205).

The disk controller unit 120 is monitoring the operational state of the disk drive 51β by the inquiry via the control line 48. And when recognizing the fact that the disk drive 51β was shifted to the "power off" mode, the disk controller unit 120 transmits a command to the power controller 81 of the additional casing 30 via the control line 48 to decrease the rotational speed of the cooling fan 66 of the cooling fan unit 58 mounted in the additional casing 30 (S1206). When receiving the command, the power controller 81 reduces the rotational speed of the cooling fan 66, for example, by decreasing a drive voltage for the cooling fan 66 (S1207) and terminates its backup operation.

In this connection, such control can also be realized, for example, by the disk drive 51β which transmits a command to the cooling fan unit 58 to reduce its rotational speed, and the control itself can be carried out by the CPU mounted in the cooling fan unit 58. The degree of reduction of the rotational speed of the cooling fan 66 may be determined to have a sufficient cooling capacity depending on the operational mode of the disk drive 51β. Further, the number of driven cooling fans 66 may be adjusted by the power controller 81 which controls the AC/DC power supply 57 depending on the operational state of the disk drive 51.

Furthermore, the rotational speed of the cooling fan 66 can also be controlled finely depending on the operational state of the disk drive 51β varying from time to time, by the disk controller unit 120 or by the power controller 81 of the additional casing 30 which monitors the operational states of the disk drives 51β in real time or in short intervals. It is also possible to automatically set the rotational speed at an optimum value based on a temperature detected by a sensor or the like.

As has been explained above, since the operation of the disk drive 51 and the cooling ability of the cooling fan 66 can be controlled at a necessary time such as backup, power saving and noise reduction can be realized.

Although the explanation has been made in connection with the present embodiment, the embodiment is given only for easy understanding of the present invention and thus the present invention is not limited to the specific example. The present invention can be modified and changed without departing from the subject matter of the invention, and obviously, numerous equivalents thereof are included in the present invention.

5. Another Embodiment

Various functions of the disk controller unit 120 and power controller 81 as mentioned above are not always required to be provided in such a manner as mentioned above. Thus provision of the various functions to the disk controller unit 120 or power controller 81 can be freely determined depending on various circumstances.

The cooling device mounted in the basic casing 20 or additional casing 30 is not limited to the aforementioned cooling fan unit 58, but may be, for example, a water-cooling type cooler or a Peltier (effect) element.

In another embodiment, the function of the host computer 300 for measuring an access frequency to each disk drive 51 may be provided to the disk array apparatus 10 so that, when the disk array apparatus 10 judges that the access frequency to the disk drive 51 (such as SATA drive) usually operating in the "power off" mode exceeded a predetermined threshold value, data stored in the associated disk drive 51 is stored in the disk drive (e.g., FC drive) 51 usually operating in the "ready" mode. As a result, the lives of the drives can be averaged and thus its maintenance efficiency can be increased.

The present invention can also be applied to a storage apparatus other than the disk array apparatus, for example, even to not disk drives but storage devices using semiconductor disks as storage devices.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A disk array apparatus, comprising:
   a controller having a communication control unit for accepting a data input/output request, a disk controller unit for controlling a plurality of disk drives, and a cache memory for temporarily storing data transferred between said communication control unit and said disk controller unit;
   the plurality of disk drives being connected to the disk controller unit to communicate with the disk controller unit, the plurality of disk drives including a first disk drive; and
   a plurality of cooling fans cooling the plurality of disk drives, the plurality of cooling fans including a first cooling fan related to the first disk drive,
   wherein in response to receiving a backup request, the controller controls the rotational speed of the first cooling fan and changes an operational mode of the first disk drive related to the backup request such that the rotational speed of the first cooling fan is increased before the operational mode of the first disk drive is changed from a first mode of not storing data related to the backup request to a second mode of storing data related to the backup request.

2. The disk array apparatus according to claim 1, wherein:
   the rotational speed of the first cooling fan is increased based on the change in the operational mode of the first disk drive from a power off mode to a ready mode.

3. The disk array apparatus according to claim 1, wherein:
   the rotational speed of the first cooling fan is changed from a low-power-consumption mode to a normal mode based on the change in the operational mode of the first disk drive from a power off mode to a ready mode.

4. The disk array apparatus according to claim 1, wherein:
   the rotational speed of the first cooling fan is reduced based on the change in the operational mode of the first disk drive from a ready mode to a power off mode.

5. A disk array apparatus, comprising:
   a controller controlling a Redundant Array of Inexpensive Disks (RAID) function;
   a plurality of disk drives including a first disk drive; and
   a cooling fan related to the first disk drive,
   wherein in response to receiving a backup request, the controller controls the rotational speed of the cooling fan and changes an operational mode of the first disk drive related to the backup request such that the rotational speed of the cooling fan is increased before the operational mode of the first disk drive is changed from a first mode of not storing data related to the backup request to a second mode of storing data related to the backup request.

6. The disk array apparatus according to claim 5, wherein:
   the rotational speed of the cooling fan is increased based on the change in the operational mode of the first disk drive from a power off mode to a ready mode.

7. The disk array apparatus according to the claim 5, wherein:
   the rotational speed of the cooling fan is changed from a low-power-consumption mode to a normal mode based on the change in operational mode of the first disk drive from a power off mode to a ready mode.

8. The disk array apparatus according to claim 5, wherein:
   the rotational speed of the cooling fan is reduced based on the change in the operational mode of the first disk drive from a ready mode to a power off mode.

9. The disk array apparatus according to the claim 5, wherein:
   the controller is included in a first housing, and
   the plurality of disk drives and the cooling fan are included in a second housing outside of the first housing.

10. A control method for a disk array apparatus having a controller, a plurality of disk drives, including a first disk drive, and a cooling fan related to the first disk drive, the control method comprising:
    controlling, by the controller, a Redundant Array of Inexpensive Disks (RAID) function;
    changing, in response to receiving a backup request, the rotational speed of the cooling fan and changing an operational mode of the first disk drive related to the backup request such that the rotational speed of the cooling fan is increased before the operational mode of the first disk drive is changed from a first mode of not storing data related to the backup request to a second mode of storing data related to the backup request.

11. The control method according to the claim 10, wherein:
    in the changing step, for changing the rotational speed of the cooling fan, the rotational speed of the cooling fan is increased based on the change in the operational mode of the first disk drive from a power off mode to a ready mode.

12. The control method according to the claim 10, wherein:
    in the changing step, for changing the rotational speed of the cooling fan, the rotational speed of the cooling fan is changed from a low-power-consumption mode to a normal mode based on the change in the operational mode of the first disk drive from a power off mode to a ready mode.

13. The control method according to the claim 10, wherein:
    in the changing step, for changing the rotational speed of the cooling fan, the rotational speed of the cooling fan is reduced based on the change in the operational mode of the first disk drive from a ready mode to a power off mode.

14. The control method according to the claim 10, wherein:
    the controller is included in a first housing, and
    the plurality of disk drives and the cooling fan are included in a second housing outside of the first housing.

* * * * *